(12) United States Patent
Gohara

(10) Patent No.: US 9,472,488 B2
(45) Date of Patent: Oct. 18, 2016

(54) SEMICONDUCTOR DEVICE AND COOLER THEREOF

(71) Applicant: FUJI ELECTRIC CO., LTD., Kawasaki-shi (JP)

(72) Inventor: Hiromichi Gohara, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 155 days.

(21) Appl. No.: 14/374,419

(22) PCT Filed: Apr. 11, 2013

(86) PCT No.: PCT/JP2013/060881
§ 371 (c)(1),
(2) Date: Jul. 24, 2014

(87) PCT Pub. No.: WO2013/157467
PCT Pub. Date: Oct. 24, 2013

(65) Prior Publication Data
US 2014/0376184 A1    Dec. 25, 2014

(30) Foreign Application Priority Data
Apr. 16, 2012  (JP) .................................. 2012-092956

(51) Int. Cl.
*H05K 7/20* (2006.01)
*H01L 23/473* (2006.01)
(Continued)

(52) U.S. Cl.
CPC ............... *H01L 23/467* (2013.01); *F28F 3/00* (2013.01); *F28F 9/00* (2013.01); *H01L 23/36* (2013.01);
(Continued)

(58) Field of Classification Search
CPC ......... H01L 23/473–23/4735; H05K 7/20254; H05K 7/20927–7/20936
See application file for complete search history.

(56) References Cited

U.S. PATENT DOCUMENTS 4,953,634 A  *  9/1990  Nelson ...................... F28F 3/02
                                                      165/147
5,002,123 A  *  3/1991  Nelson ...................... F28F 3/02
                                                      165/147
(Continued)

FOREIGN PATENT DOCUMENTS

JP      H06-326226 A    11/1994
JP      2001-035981 A    2/2001
(Continued)

OTHER PUBLICATIONS

Europe Patent Office, "Search Report for EP 13778515.0," Nov. 24, 2015.
(Continued)

*Primary Examiner* — Robert J Hoffberg
(74) *Attorney, Agent, or Firm* — Manabu Kanesaka

(57) ABSTRACT

A semiconductor device exhibits low pressure loss and is capable of cooling a plurality of power semiconductor chips evenly. This semiconductor device includes a semiconductor module and a cooler for cooling a power semiconductor element mounted in the semiconductor module. A cooling unit of the cooler has a first header part that has a first bottom surface disposed between a coolant inlet and an end portion of a first substrate on the coolant outlet side and inclined toward a bottom plane of cooling fins so that a coolant supplied from the coolant inlet flows toward the cooling fins; and a second header part that has a second bottom surface inclined from an end portion of the bottom plane of the cooling fins on the coolant outlet side so that the coolant discharged from the cooling fins flows to the coolant outlet.

8 Claims, 9 Drawing Sheets

(51) Int. Cl.
*H01L 23/467* (2006.01)
*F28F 3/00* (2006.01)
*F28F 9/00* (2006.01)
*H01L 23/36* (2006.01)
*H01L 25/07* (2006.01)
*H01L 23/373* (2006.01)
*H01L 23/00* (2006.01)

(52) U.S. Cl.
CPC ......... *H01L 23/473* (2013.01); *H05K 7/20254* (2013.01); *H05K 7/20927* (2013.01); *H01L 23/3735* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48091* (2013.01); *H01L 2224/48137* (2013.01); *H01L 2224/73265* (2013.01); *H01L 2924/1305* (2013.01); *H01L 2924/13055* (2013.01); *H01L 2924/13091* (2013.01); *H01L 2924/19107* (2013.01)

(56) References Cited

U.S. PATENT DOCUMENTS

| | | | | |
|---|---|---|---|---|
| 6,414,867 | B2* | 7/2002 | Suzuki | H02M 7/003 361/709 |
| 6,978,856 | B2* | 12/2005 | Nakamura | B60H 1/00392 165/43 |
| 7,090,044 | B2* | 8/2006 | Nakamura | B60H 1/00392 180/65.8 |
| 7,252,167 | B2* | 8/2007 | Nakamura | B60H 1/00392 180/68.4 |
| 7,660,122 | B2* | 2/2010 | Nakamura | B60H 1/00392 165/104.33 |
| 7,983,044 | B2* | 7/2011 | Nakamura | B60H 1/00392 165/104.33 |
| 8,081,465 | B2* | 12/2011 | Nishiura | H01L 23/3735 165/147 |
| 8,902,589 | B2* | 12/2014 | Gohara | H01L 23/3735 165/104.19 |
| 9,190,344 | B2* | 11/2015 | Mori | H01L 23/473 |
| 9,220,182 | B2* | 12/2015 | Otsuka | H05K 7/20236 |
| 9,237,676 | B2* | 1/2016 | Gohara | H01L 23/3735 |
| 9,238,275 | B2* | 1/2016 | Yasuda | B23K 1/0012 |
| 9,245,821 | B2* | 1/2016 | Gohara | H01L 23/3735 |
| 9,263,367 | B2* | 2/2016 | Nakagawa | H01L 23/473 |
| 2001/0014029 | A1 | 8/2001 | Suzuki et al. | |
| 2004/0020231 | A1 | 2/2004 | Nakamura et al. | |
| 2008/0237847 | A1 | 10/2008 | Nakanishi et al. | |
| 2009/0145581 | A1* | 6/2009 | Hoffman | F28F 1/40 165/80.3 |
| 2010/0172091 | A1 | 7/2010 | Nishiura | |

FOREIGN PATENT DOCUMENTS

| | | |
|---|---|---|
| JP | 2001-308246 A | 11/2001 |
| JP | 2002-093974 A | 3/2002 |
| JP | 2004-006811 A | 1/2004 |
| JP | 2004-128439 A | 4/2004 |
| JP | 2007-081375 A | 3/2007 |
| JP | 2007-324531 A | 12/2007 |
| JP | 2008-167650 A | 7/2008 |
| JP | 2008-251932 A | 10/2008 |
| JP | 2008-263137 A | 10/2008 |
| JP | 3152132 U | 7/2009 |
| JP | 2010-123881 A | 6/2010 |
| JP | 2010-153785 A | 7/2010 |
| WO | 2013/118809 A1 | 8/2013 |

OTHER PUBLICATIONS

PCT, "International Search Report for International Application No. PCT/JP2013/060881".

* cited by examiner

Fig. 9(a) Prior Art
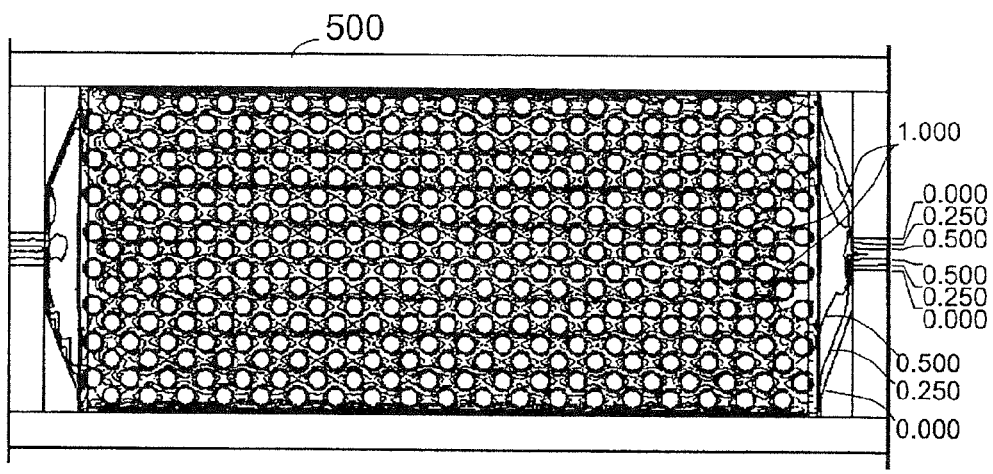
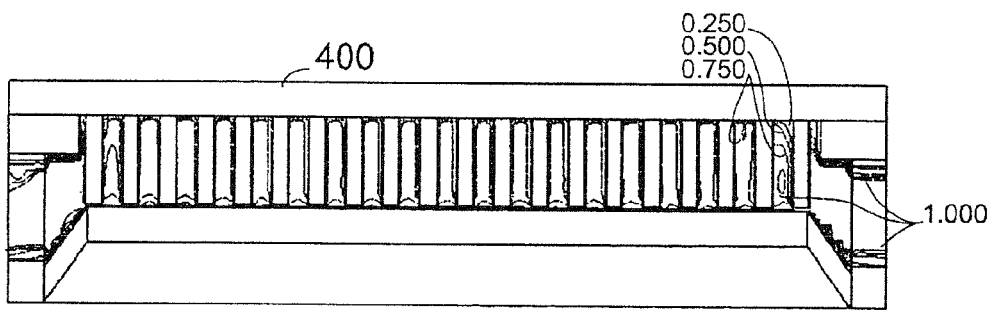
Fig. 9(b) Prior Art

SEMICONDUCTOR DEVICE AND COOLER THEREOF

RELATED APPLICATIONS

The present application is National Phase of International Application No. PCT/JP2013/060881 filed Apr. 11, 2013, and claims priority from Japanese Application No. 2012-092956 filed Apr. 16, 2012.

TECHNICAL FIELD

The present invention relates to a semiconductor device that has at least a semiconductor module and a cooler, and to the cooler used in this semiconductor device.

BACKGROUND ART

Semiconductor modules with power semiconductor chips are used in the inverters (power converters) of the variable speed drives for the motors of electric vehicles. The elements such as insulated gate bipolar transistors (referred to as "IGBT," hereinafter) are used as the power semiconductor chips. Because the power semiconductor chips generate heat due to high current flowing therein, a semiconductor module is used in combination with a cooler. In electric vehicles and other products with limited weight and space to attach a cooler, a liquid-cooled cooler using a circulatory coolant is used in order to improve the heat dissipation performance of the semiconductor module.

A semiconductor module has a heat dissipation base that is connected thermally to power semiconductor chips via a substrate, and the heat dissipation base is provided with cooling fins. The cooling fins are accommodated in a flow path formed between the heat dissipation base and a cooler. By flowing a pressurized cooling medium (also referred to as "coolant," hereinafter) through the cooling fins, heat generated by the semiconductor chips is efficiently released to the cooling medium. The cooling medium that is warmed up by the heat released from the semiconductor chips is cooled by an external heat exchanger, which is then pressurized by a pump and then returned to the flow path in which the cooling fins are disposed.

This type of conventional technique is disclosed in, for example, Patent Documents 1 to 5.

Patent Document 1 discloses a cooling system that has a cooling unit accommodating fins therein, a partial structure that has a cross-sectional flow path that gradually narrows down in the short-side direction of the cooling unit and gradually expands in the long-side direction of the same, and a partial structure that has a cross-sectional flow path that gradually expands from the short side of the cooling unit and gradually narrows down from the long side of the same. Patent Document 2 discloses a cooler that has a parallel flow path configured by a large number of fine flow paths, a first header for distributing a coolant to each flow path of the parallel flow path, and a second header for merging the coolant flowing out of the parallel flow path. Patent Document 3 discloses a cooling device that has a protrusion disposed on an upper surface of a bottom part that configures a bottom surface of a coolant path, wherein the protrusion is formed by an upstream-side upward inclined surface and a downstream-side downward inclined surface. Patent Document 4 discloses a power module cooling unit in which a bottom surface of an opening of a heat sink is provided with a spacer for smoothly reducing the cross-sectional area of a flow path. Patent Document 5 discloses a semiconductor cooling device in which a flow path cover is formed in such a manner that the clearance between the flow path cover and the edges of the pin-shaped fins is wide on the inlet side and narrow on the outlet side. Patent Document 6 discloses a cooling device in which heat transfer fins are formed in such a manner that a coolant is placed higher on the inlet side than on the outlet side.

Patent Document 1: Japanese Patent Application Publication No. 2004-6811 (FIGS. 1 and 7, paragraphs 0023 to 0031, and 0056 to 0061)

Patent Document 2: Japanese Patent Application Publication No. 2001-35981 (FIGS. 1 and 2, paragraphs 0020 to 28)

Patent Document 3: Japanese Patent Application Publication No. 2008-263137 (FIG. 11, paragraphs 0035 to 0038)

Patent Document 4: Japanese Patent Application Publication No. 2001-308246 (FIG. 9, paragraph 0034)

Patent Document 5: Japanese Patent Application Publication No. 2010-153785 (FIGS. 7 and 8, paragraphs 0035 to 0037)

Patent Document 6: Japanese Patent Application Publication No. 2007-81375 (FIGS. 2, 3, 6, and 7, paragraphs 0038 to 0050)

Incidentally, in the semiconductor devices described above, the cooling fins tend to be designed to have detailed and complicated shapes in order to efficiently release the heat generated by the power semiconductor chips. The use of the cooling fins of such shapes is likely to increase pressure loss in the coolers, creating a need for a high-output pump for circulating the coolant. On the other hand, reducing the sizes of the semiconductor devices or configuring the semiconductor devices to provide high outputs, leads to an increase in the amount of heat generated per unit area, creating a need for detailed, dense cooling fins, which results in an increase of pressure loss and creating a need for a large pump.

DISCLOSURE OF THE INVENTION

In a configuration where a plurality of power semiconductor chips is disposed along the direction in which a coolant flows, it is difficult to cool the chips evenly.

An object of the present invention, therefore, is to solve these problems and to provide a semiconductor device, whether small or high-output, which is capable of not only keeping its cooling performance with low pressure loss without using a large pump, but also evenly cooling a plurality of power semiconductor chips therein, as well as a cooler used in this semiconductor device.

In order to solve the problems described above, a semiconductor device according to a first aspect of the present invention is a semiconductor device that has a semiconductor module and a cooler for cooling a power semiconductor element mounted on a substrate in the semiconductor module. The semiconductor device comprises at least: a heat dissipation base; cooling fins which form a cluster of a plurality of pin members or blade members having an approximately rectangular cuboid contour, and which are provided on a first principal surface of the heat dissipation base; a cooler which is fixed to the heat dissipation base and has a cooling unit accommodating the cooling fins therein and a coolant inlet and a coolant outlet that are formed at respective ends of the cooling unit to face each other in a longitudinal direction; a first substrate which is bonded, in the vicinity of the coolant inlet, to a second principal surface of the heat dissipation base such that the position of the first substrate corresponds to the position of the cooling fins; and a second substrate which is bonded, in the vicinity of the coolant outlet, to the second principal surface of the heat dissipation base.

Furthermore, the cooling unit has: a first header part that has at least a first bottom surface that is inclined toward a bottom plane of the cooling fins so that a coolant supplied from the coolant inlet flows from a side plane and the bottom plane of the cooling fins on the coolant inlet side, into the cooling fins, and toward the coolant outlet; and a second header part that has at least a second bottom surface that is inclined from an end portion of the bottom plane of the cooling fins so that the coolant discharged from the cooling fins flows to the coolant outlet.

With the first header part and the second header part, the semiconductor device of the present invention can not only cool the power semiconductor elements of the first and second substrates substantially evenly, but also reduce pressure loss of the cooler, the first and second substrates being disposed in the longitudinal direction of the cooling unit.

In order to solve the problems described above, a semiconductor device according to a second aspect of the present invention is a semiconductor device that has a semiconductor module and a cooler for cooling a power semiconductor element mounted on a substrate in the semiconductor module. The semiconductor device comprises at least: a heat dissipation base; cooling fins which form a cluster of a plurality of pin members or blade members having an approximately rectangular cuboid contour, and which are provided on a first principal surface of the heat dissipation base; a cooler which is fixed to the heat dissipation base and has a cooling unit accommodating the cooling fins therein and a coolant inlet and a coolant outlet that are formed at respective ends of the cooling unit to face each other in a longitudinal direction; a first substrate which is bonded, in the vicinity of the coolant inlet, to a second principal surface of the heat dissipation base such that the position of the first substrate corresponds to the position of the cooling fins; and a second substrate which is bonded, in the vicinity of the coolant outlet, to the second principal surface of the heat dissipation base.

Furthermore, the cooling unit has: a first header part which has a first bottom surface disposed between the coolant inlet and an end portion of the first substrate on the coolant outlet side and inclined toward a bottom plane of the cooling fins so that a coolant supplied from the coolant inlet flows toward the cooling fins; and a second header part which has a second bottom surface that is inclined from an end portion of the bottom plane of the cooling fins on the coolant outlet side so that the coolant discharged from the cooling fins flows to the coolant outlet.

With the first header part and the second header part, the semiconductor device of the present invention can not only reduce pressure loss generated between the coolant inlet and the end portion of the first substrate on the coolant outlet side, but also allow the coolant to flow smoothly toward the coolant outlet. As a result, the power semiconductor elements mounted in the first substrate and the second substrate can be cooled substantially evenly, reducing the pressure loss of the cooler.

In order to solve the problems described above, a semiconductor device according to a third aspect of the present invention is a semiconductor device that has a semiconductor module and a cooler for cooling a power semiconductor element mounted on a substrate in the semiconductor module. The semiconductor device comprises at least: a heat dissipation base; cooling fins which form a cluster of a plurality of pin members or blade members having an approximately rectangular cuboid contour, and which are provided on a first principal surface of the heat dissipation base; a cooler which is fixed to the heat dissipation base and has a cooling unit accommodating the cooling fins therein and a coolant inlet and a coolant outlet that are formed at respective ends of the cooling unit to face each other in a longitudinal direction; a first substrate which is bonded, in the vicinity of the coolant inlet, to a second principal surface of the heat dissipation base such that the position of the first substrate corresponds to the position of the cooling fins; and a second substrate which is bonded, in the vicinity of the coolant outlet, to the second principal surface of the heat dissipation base.

Furthermore, the cooling unit has: a first header part for supplying a coolant from the coolant inlet toward the cooling fins; and a second header part for discharging the coolant from the cooling fins to the coolant outlet, and the areas of a side plane and a bottom plane of the cooling fins exposed into the first header part are greater than the area of a side plane of the cooling fins exposed to the second header part.

Because the areas of the side plane and bottom plane of the cooling fins exposed into the first header part are greater than the area of the side plane of the cooling fins exposed to the second header part, the semiconductor of the present invention can cool the power semiconductor chips of the cooler between the first header part and the second header part substantially evenly. Therefore, not only is it possible to reduce pressure loss of the cooler, but also the power semiconductor chips mounted in the first substrate on the first header part side and the power semiconductor chips mounted in the second substrate on the second header side can be cooled substantially evenly.

Moreover, in order to solve the problems described above, a cooler according to a fourth aspect of the present invention is a cooler for cooling a semiconductor module, which has at least: a heat dissipation base; at least two substrates bonded parallel to each other on the heat dissipation base; a power semiconductor element mounted on each of the substrates; and cooling fins which form a cluster of a plurality of pin members or blade members having an approximately rectangular cuboid contour, and which are provided on the heat dissipation base, the cooler having: a cooling unit accommodating the cooling fins therein; and a coolant inlet and a coolant outlet that are formed at respective ends of the cooling unit to face each other in a longitudinal direction.

Furthermore, the cooling unit has: a first header part which has at least a first bottom surface that is inclined toward a bottom plane of the cooling fins so that a coolant supplied from the coolant inlet flows from a side plane and the bottom plane of the cooling fins on the coolant inlet side, into the cooling fins, and toward the coolant outlet; and a second header part which has at least a second bottom surface that is inclined from an end portion of the bottom plane of the cooling fins so that the coolant discharged from the cooling fins flows to the coolant outlet. The cooler is used by being fixed to the heat dissipation base.

With the first header part and the second header part, the cooler of the present invention can not only cool the power semiconductor elements of the first and second substrates substantially evenly, but also reduce pressure loss of the cooler main body, the first and second substrates being disposed in the longitudinal direction of the cooling unit.

The first to third aspects of the present invention can provide a semiconductor device that is capable of not only cooling the power semiconductor elements of at least two substrates substantially evenly, but also reducing power loss of a cooler of the semiconductor device.

The fourth aspect of the present invention can provide a cooler that is capable of not only cooling the power semiconductor elements of at least two substrates substantially evenly, but also reducing power loss of the cooler main body.

BRIEF DESCRIPTION OF THE DRAWINGS

FIGS. 3(a) and 3(b) are perspective views, schematically showing the principal parts of the semiconductor device according to the embodiment of the present invention, wherein FIG. 3(a) is a diagram showing a substrate, a heat dissipation base, and a cooler, and FIG. 3(b) is a diagram showing cooling fins and the cooler;

FIGS. 4(a)-4(c) are perspective views showing the heat dissipation base according to the embodiment of the present invention, wherein FIG. 4(a) is a diagram showing a first modification of the cooling fins, FIG. 4(b) is a diagram showing a second modification of the cooling fins, and FIG. 4(c) is a diagram showing a third modification of the cooling fins;

FIGS. 5(a) and 5(b) are cross-sectional diagrams of the semiconductor device according to the embodiment of the present invention, taken along the arrow 5A-5A shown in FIG. 3(a), wherein FIG. 5(a) is a diagram showing a first modification of the cooler, and FIG. 5(b) is a diagram showing a second modification of the cooler;

FIGS. 6(a)-6(d) are plan views showing the cooler according to the embodiment of the present invention, wherein FIG. 6(a) is a diagram showing a first modification, FIG. 6(b) is a diagram showing a second modification, FIG. 6(c) is a diagram showing a third modification, and FIG. 6(d) is a diagram showing a fourth modification;

FIGS. 8(a) and 8(b) are contour diagrams showing a distribution of flow velocities of a coolant in the semiconductor device according to the embodiment of the present invention, wherein FIG. 8(a) is a plan view and FIG. 8(b) is a side view; and FIGS. 9(a) and 9(b) are contour diagrams showing a distribution of flow velocities of a coolant in the conventional semiconductor device, wherein FIG. 9(a) is a plan view and FIG. 9(b) is a side view.

BEST MODE FOR CARRYING OUT THE INVENTION

Preferred embodiments of a semiconductor device according to the present invention and a cooler used in this semiconductor device are described hereinafter with reference to the accompanying drawings. The accompanying drawings are provided for the purpose of illustrating the embodiment of the present invention specifically. The terms indicating such directions as "upper," "lower," "bottom," "front," and "back" are used with reference to the directions illustrated in the accompanying drawings.

Figure 1:
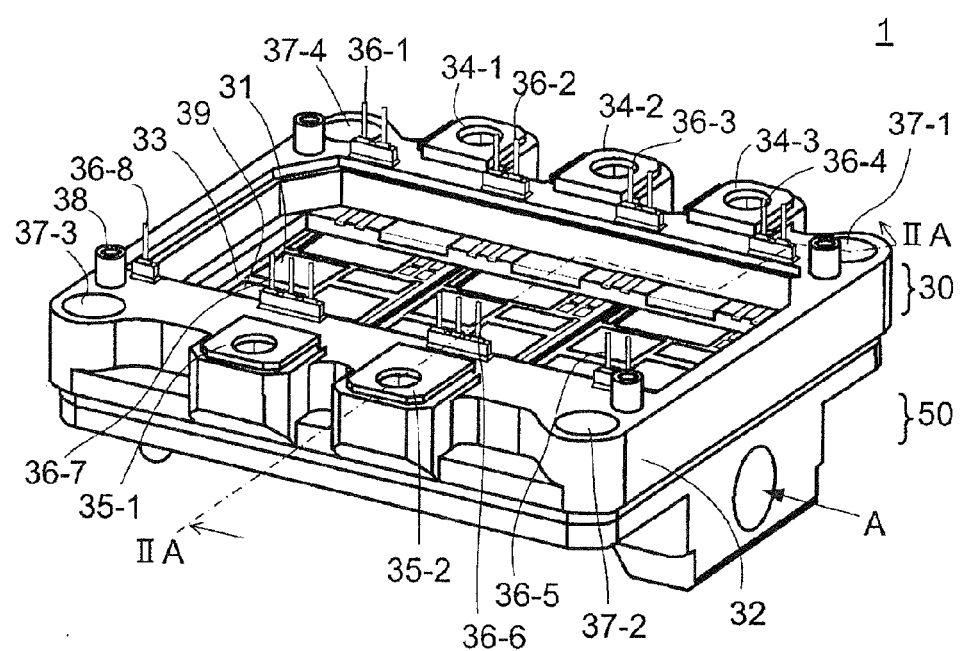
FIG. 1 is a perspective view of a semiconductor device according to an embodiment of the present invention.
Figure 2A:
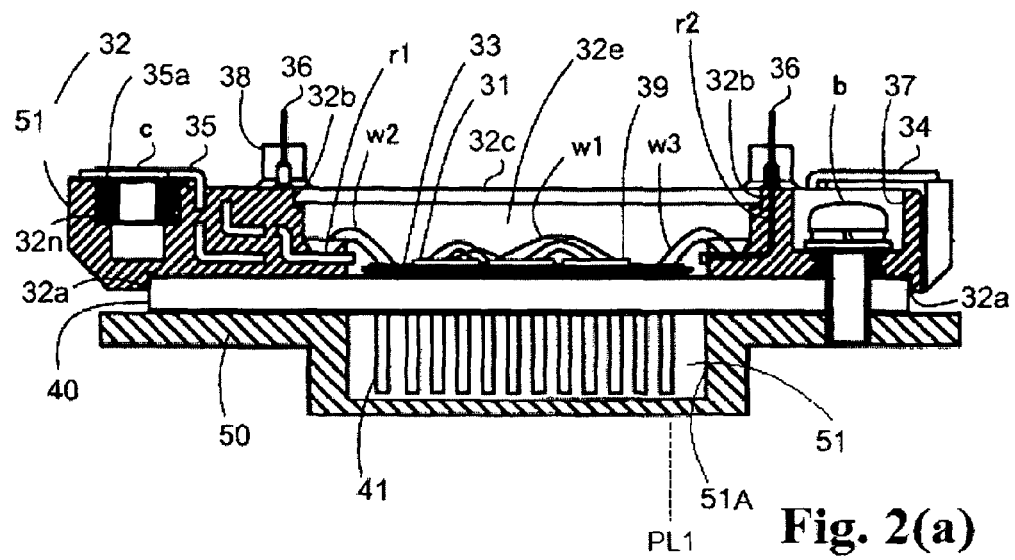
FIG. 2(a) is a cross-sectional side view of the semiconductor device according to the embodiment of the present invention, taken along the arrow IIA-IIA and viewed from A-side shown in FIG. 1.

FIG. 1 is a perspective view of a semiconductor device according to an embodiment of the present invention. FIG. 2(a) is a cross-sectional side view of the semiconductor device, taken along the arrow IIA-IIA and viewed from A-side shown in FIG. 1.

As shown in FIGS. 1 and 2(a), a semiconductor device 1 has a semiconductor module 30 equipped with power semiconductor chips 31, and a cooler 50 for cooling the power semiconductor chips 31.

The semiconductor module 30 has at least a surrounding case 32 and an insulating substrate 33 to which the power semiconductor chips 31 are bonded.

The surrounding case 32 is an O-shaped or frame-shaped resin case that has an approximately rectangular cuboid contour. The surrounding case 32 is internally provided with three insulating substrates 33. The resin is, for example, polyphenylene sulfide. One of the sides of the frame portion of the surrounding case 32 is provided with a main terminal (U) 34-1, a main terminal (V) 34-2, and a main terminal (W) 34-3, and another side of the frame portion is provided with a power supply terminal (P) 35-1 and a power supply terminal (N) 35-2. The main terminal (U) 34-1, the main terminal (V) 34-2, and the main terminal (W) 34-3 are terminals for driving, for example, an external motor by performing switching control of the power semiconductor chips 31. The power supply terminal (P) 35-1 and the power supply terminal (N) 35-2 are terminals supplied with power from the outside.

As shown in FIG. 2(a), the power supply terminal 35 is provided with an open hole 35a. A screw, not shown, is inserted into the open hole 35a and then fastened to a nut 32n disposed in the surrounding case 32. The power supply terminal 35 is installed on the front surface of the surrounding case 32 in the bent form. These terminals are provided to the surrounding case 32 by means of, for example, insert molding.

Control terminals 36-1 to 36-8 are relay terminals for connecting the gate electrodes of the power semiconductor chips 31 of the surrounding case 32 to a control circuit on a circuit board, not shown, and performing the switching control of the power semiconductor chips 31 in response to a control signal transmitted from the control circuit. The four corners of the frame of the surrounding case 32 are provided with openings 37-1 to 37-4. Screws b are inserted into these openings 37-1 to 37-4 to tightly fix the semiconductor module 30 and the cooler 50 to each other. The surrounding case 32 is also provided with screw seats 38 for the purpose of attaching the circuit board (not shown) to an upper surface of the surrounding case 32.

The insulating substrates 33 are each formed by bonding a plate-like circuit pattern made of copper, copper alloy or the like to either surface of a ceramic or resin insulating plate. Each of the insulating substrates 33 is mounted with a power semiconductor chip 31 such as an IGBT or MOSFET, and an FWD 39 (Free Wheeling Diode) which is a diode for commutating a load current. The plurality of power semiconductor elements 31 and FWDs 39 are connected to each other by a bonding wire w1. In each of the insulating substrates 33, the power semiconductor chip 31 and the FWD 39 are connected antiparallel to each other, for example, by a bonding wire, not shown, in addition to the bonding wire w1, and are electrically connected so as to form upper and lower arms.

Furthermore, lead terminals r1, r2 are insert-molded in the frame portion of the surrounding case 32 and connected to the power semiconductor chips 31 and the like by bonding wires w2, w3. Each power semiconductor chip 31 is electrically connected to the motor driving main terminal 34 by a bonding wire, not shown, via the lead terminal, etc. The gate of each power semiconductor chip 31 is connected to the lead terminal r2 by the bonding wire w3, and the lead terminal r2 is connected to the control terminal 36.

Figure 2B:
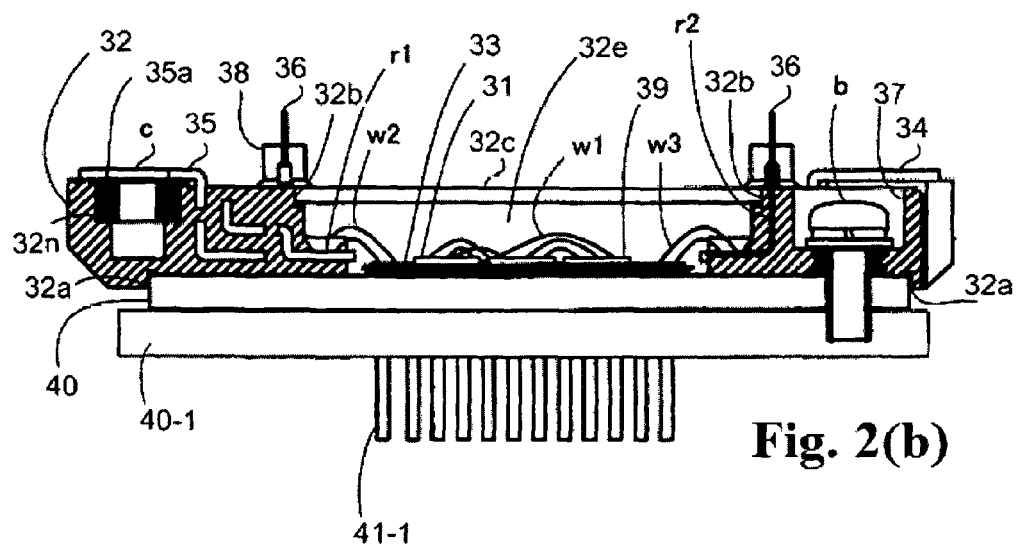
FIG. 2(b) shows a modification of FIG. 2(a)

As shown in FIG. 2(*a*), the openings on the bottom surface side of the surrounding case 32 have a heat dissipation base that is adhered to opening stepped surfaces 32*a* by an adhesive to close the openings. The heat dissipation base has a heat dissipation base plate 40 and cooling fins 41. The heat dissipation base plate 40 is formed from a plate-like member made of or plated with copper, copper alloy, aluminum or aluminum alloy. The cooling fins 41 are formed on the lower surface of the heat dissipation base plate 40 by a known method, for the purpose of cooling the heat dissipation base plate 40 and the power semiconductor chips 31. Each insulating substrate 33 and the power semiconductor chips 31 thereof are bonded sequentially in this order to the upper surface of the heat dissipation base. Such a semiconductor module in which the insulating substrates 33 are bonded to the heat dissipation base is called "direct water-cooled semiconductor module" and is used mainly in a water-cooled semiconductor device that uses water, long life coolant (LLC), or other form of liquid as a coolant. In the direct water-cooled semiconductor module, cooling efficiency thereof can be improved by arranging the shapes and positions of the power semiconductor chips 31, the cooling fins 41, and a cooling unit 51, reducing the load on a pump used for circulating the coolant. In addition, the flow rate of the coolant can be made higher than that in a conventional semiconductor module, improving the properties and reliability of the semiconductor device.

FIG. 2(*b*) shows a modification of the heat dissipation base and the semiconductor device 1 using the same. In this modification, the heat dissipation base has at least the heat dissipation base plate 40, a base plate 40-1, and cooling fins 41-1. The heat dissipation base plate 40 is adhered to the bottom surface of the surrounding case 32. The heat dissipation base plate 40 is not provided with any cooling fins, but the base plate 40-1 having the cooling fins 41-1 implanted therein is tightly fixed to the heat dissipation base plate 40 via a thermal compound or the like. The semiconductor module with this heat dissipation base is used mainly in an air-cooled semiconductor device that uses air or other form of gas as a coolant.

The insulating substrates 33 are soldered or bonded by sintered metal or the like to the upper surface of the heat dissipation base plate 40.

An internal space of the surrounding case 32 is filled with a sealing member 32*e* made of silicone gel, silicone resin, or epoxy resin. A resin lid plate 32*c* is tightly adhered to opening stepped surfaces 32*b* of the surrounding case 32 by an adhesive, not shown, to close the surrounding case 32. Moreover, each opening 37 is provided for the purpose of fixing the surrounding case 32 to the cooler and the like by bolts, as will be described later.

The semiconductor device 1 is used, with the circuit board, not shown, being attached to the screw seats 38 of the surrounding case 32. The front surface of the circuit board is mounted with a control circuit configured by various circuit elements such as an IC (Integrated Circuit), an LSI (Large Scale Integration), a transistor, a resistor, and a capacitor. Note that the semiconductor device 1 does not need to have the circuit board therein and therefore may be configured in such a manner as to be controlled while connected to external equipment provided with the same functions.

Figure 3A:
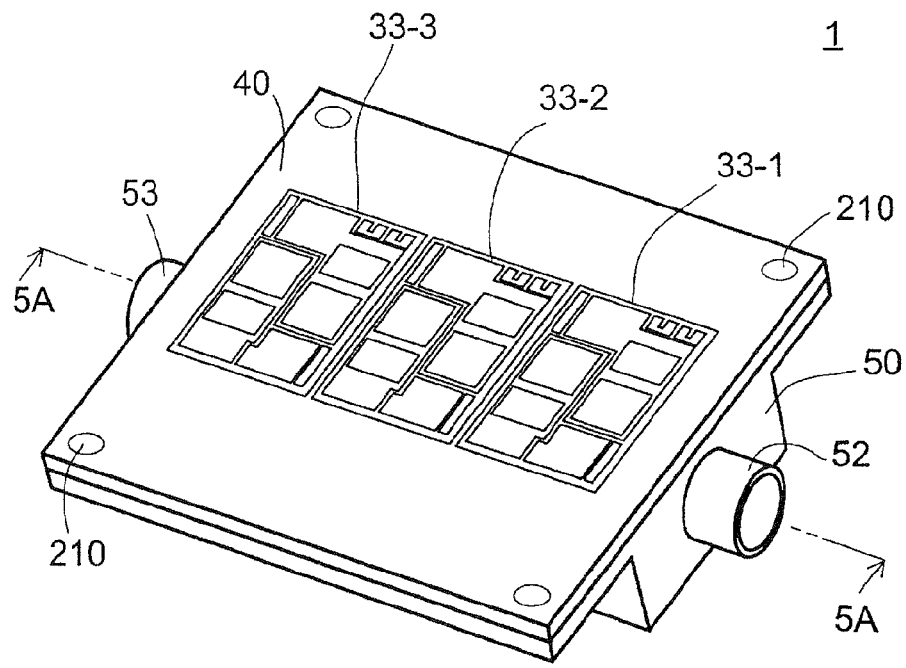
Figure 3B:
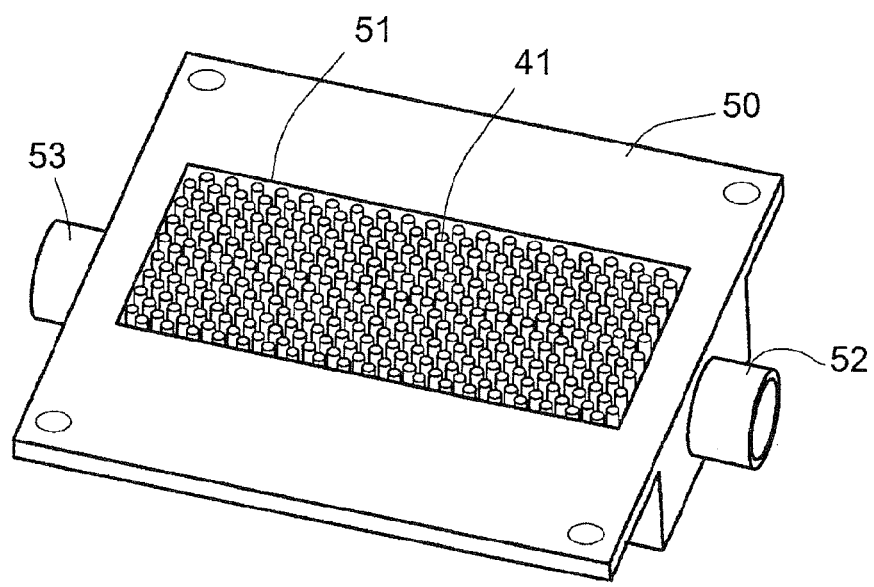

FIGS. 3(*a*) and 3(*b*) are perspective views, schematically showing the principal parts of the semiconductor device according to the embodiment of the present invention, wherein FIG. 3(*a*) is a diagram showing an arrangement of the insulating substrates 33, the heat dissipation base, and the cooler 50, and FIG. 3(*b*) is a diagram showing an arrangement of the cooling fins 41 of the heat dissipation base and the cooler 50.

The cooler 50 is tightly fixed to the semiconductor module 30 by screws and bolts via a sealing member, as described above, for example. The cooler 50 is molded from a known material, such as aluminum or aluminum alloy.

As shown in FIGS. 3(*a*) and 3(*b*), the cooler 50 has the cooling unit 51 accommodating the cooling fins 41 therein, and a coolant inlet 52 and a coolant outlet 53, which are configured to communicate with the cooling unit 51. The cooling unit 51 is an approximately rectangular cuboid concave portion provided in the box-shaped cooler 50, and looks roughly like a rectangle as viewed in plan. The coolant inlet 52 and the coolant outlet 53 are formed in such a manner that the centers of the openings thereof are located on the surfaces on the narrow sides of the cooling unit 51, i.e., approximately in the central parts of the two side surfaces of the cooling unit 51 that face each other in the longitudinal direction. The openings are in, for example, a circular or oval shape. The direction in which the coolant is supplied from the coolant inlet 52 and the direction in which the coolant is discharged from the coolant outlet 53 are roughly parallel to the longitudinal direction of the cooling unit 51.

Connected to the cooler 50 is a pump, not shown, to supply the coolant from the coolant inlet 52 on the upstream side to the cooling unit 51 and to discharge the coolant from the coolant outlet 53 on the downstream side, creating a cooling system in which the coolant circulates.

At least two of the insulating substrates 33 are bonded onto the heat dissipation base in such a manner that these insulating substrates 33 are arranged sequentially from the coolant inlet 52 side along the longitudinal direction of the cooling unit 51. In FIG. 3(*a*), three insulating substrates 33-1, 33-2, 33-3 in the same contour and size are disposed adjacent to each other from the coolant inlet 52 to the coolant outlet 53.

The cooling fins 41 are formed on the surface that faces the surface of the heat dissipation base plate 40 to which the insulating substrates 33-1, 33-2, 33-3 are bonded. The cooling fins 41 are preferably disposed on a surface immediately below the insulating substrates 33-1, 33-2, 33-3, with a short distance therebetween and hence a low thermal resistance, in such a manner that heat generated by the power semiconductor chips 31 is released efficiently. Because the heat that is generated from the power semiconductor chips 31 spreads in the in-plane direction, the heat dissipation base is preferably configured in such a manner that the area of the surface of the heat dissipation base plate 40 to which the cooling fins 41 are adhered is greater than the total area of the insulating substrates 33-1, 33-2, 33-3. It is also preferred that the cooler 50 be configured in such a manner that a constant gap is formed between the cooling unit 51 and the cooling fins 41. The insulating substrates 33-1, 33-2, 33-3 are disposed so as not to be higher than the side walls of the cooling unit 51. In other words, the insulating substrates 33-1, 33-2, 33-3 are disposed in such a manner as to face a coolant flow path configured by the cooling unit 51.

The cooling fins 41 are formed of a plurality of pin members or blade members that has an approximately rectangular cuboid contour. The cooling fins 41 are made of copper, copper alloy, aluminum, aluminum alloy, or other known materials and formed on the dissipation base plate 40 by a known method of integral molding, carving, implantation, or the like. The length of the edges of the fins or blades measured from the principal surface of the heat dissipation base plate 40 is preferably 6 mm to 10 mm. The cooling fins 41 can be in any shapes including the known shapes. In view of achieving uniform cooling performance, it is desired that the height of the pins or the like be made even and that each of cooling fin 41 have approximately a rectangular cuboid contour so that the virtual plane obtained by connecting the edges thereof becomes substantially parallel to the surface of the heat dissipation base plate 40.

It is preferred that the inner diameters of the openings of the coolant inlet 52 and the coolant outlet 53 be equal to or greater than the length of the cooling fins 41 in order to keep the cooling performance and reduce pressure loss of the entire cooling system. For example, when the length of the pins is 10 mm, pressure loss can be reduced by setting the inner diameters at 10 mm or longer. From the perspective of the cooling performance, it is also preferred that the openings be in an oval shape where the short diameter is equal to or longer than the length of the cooling fins 41 and the long diameter is approximately equivalent to the width of the region where the power semiconductor chips 31 are disposed, so that the coolant spreads over the heat generating portion.

Figure 4A:
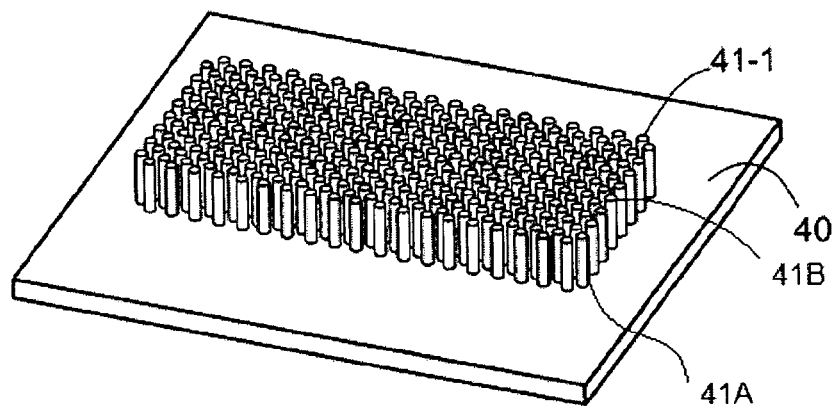
Figure 4B:
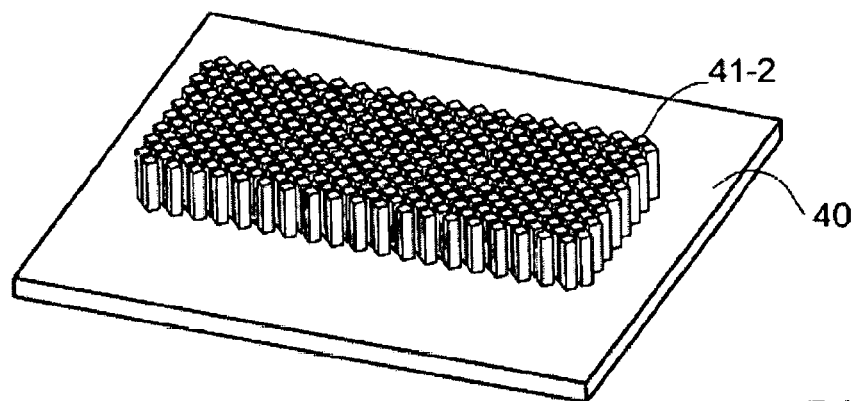
Figure 4C:
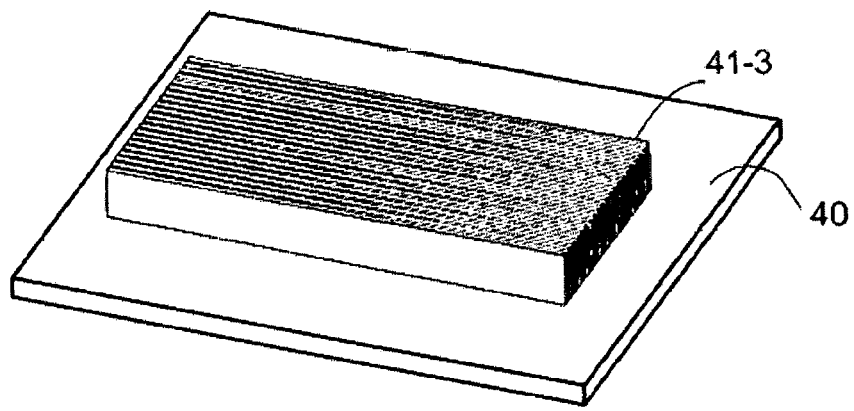

FIGS. 4(a)-4(c) are perspective views illustrating the heat dissipation base according to the embodiment of the present invention, wherein FIG. 4(a) shows a first modification of the cooling fins, FIG. 4(b) shows a second modification of the cooling fins, and FIG. 4(c) shows a third modification of the cooling fins. FIG. 4(a) shows an example in which round pins are used as the cooling fins 41-1 (each pin 41 includes a side surface 41A, and a bottom surface 41B), FIG. 4(b) shows an example in which square pins are used as cooling fins 41-2, and FIG. 4(c) shows an example in which blades are used as cooling fins 41-3. When using the pins as the cooling fins, it is preferred that the pins be staggered 45° to the longitudinal direction in order to inhibit abnormal flows of the coolant and improve the cooling efficiency.

Figure 5A:
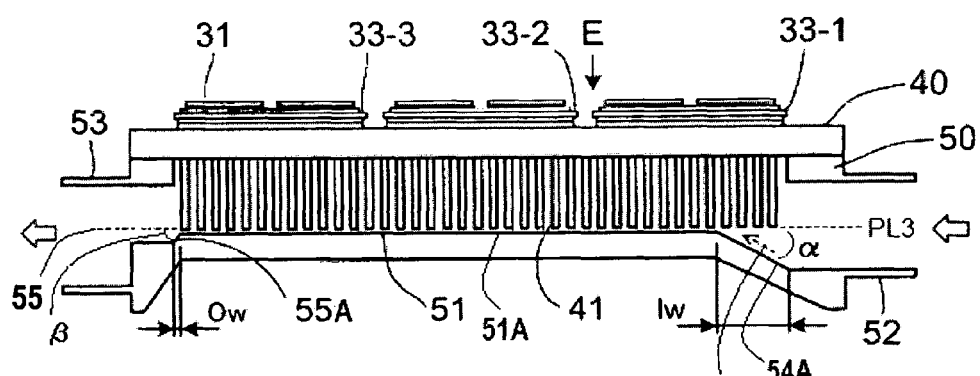
Figure 5B:
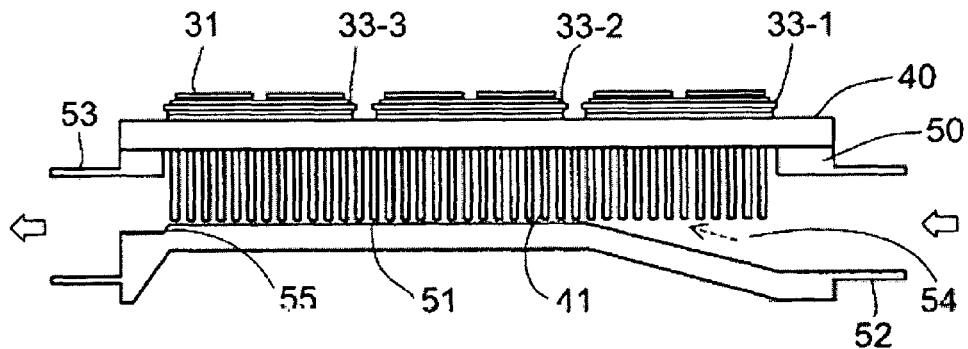

FIGS. 5(a) and 5(b) are cross-sectional diagrams of the principal parts of the semiconductor device 1 according to the embodiment of the present invention, taken along the arrow 5A-5A shown in FIG. 3(a), wherein FIGS. 5(a) and 5(b) show first and second modifications of the cooler 50, respectively. The white arrows in each diagram indicate a direction of the flow of the coolant. FIGS. 6(a)-6(d) are plan views showing the coolant flow path in the cooler according to the embodiment of the present invention, viewed from the heat dissipation base side, wherein FIGS. 6(a) to 6(d) show first, second, third and fourth modifications of the cooling unit 51, respectively. The two-dot chain lines indicate the positions of the insulating substrates 33-1, 33-2, 33-3.

In the cooler 50, the cooling unit 51 accommodating the cooling fins 41 therein has a first header part 54 on the coolant inlet 52 side and a second header part 55 on the coolant outlet 53 side.

Figure 6A:
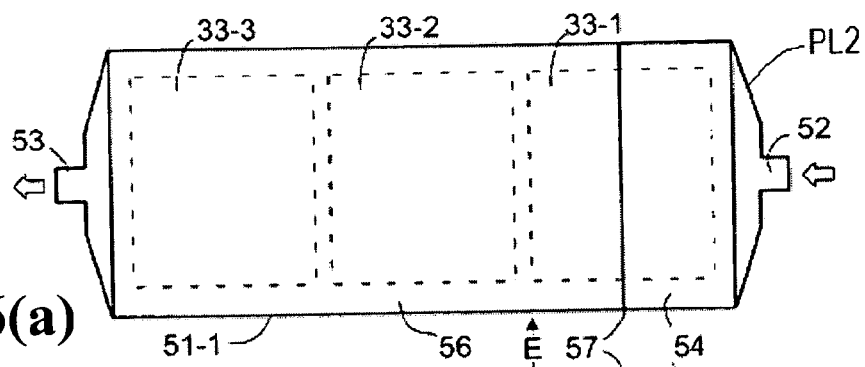

The first header part 54 has an enlarged portion with a gradually increasing cross-sectional area, which has a side wall PL2 (FIG. 6(a)) that is inclined in such a manner that the coolant introduced from the coolant inlet 52 into the cooler 50 spreads evenly toward a side plane PL1 (FIG. 2(a)) of the cooling fins 41, and a reduced portion with a gradually reducing cross-sectional area, which accommodates the end portions on one side of the cooling fins 41 therein and has an inclined surface, i.e. first flow surface 54A (FIG. 5(a)), for sending the coolant into the cooling fins 41.

The bottom surface of the reduced portion of the first header part 54 is inclined at an angle α(FIG. 5(a)) toward the bottom plane PL3 (FIG. 5(a)) of the cooling fins 41, i.e., the virtual plane obtained by connecting the edges of the pins or blades. The inclination is formed anywhere between a part of the first header part 54 on the coolant inlet 52 side and an end portion of the insulating substrate 33-1 on the coolant outlet 53 side (the position E shown in FIGS. 5(a) and 6(a)). For the purpose of achieving uniform cooling performance, it is preferred that the inclination be formed anywhere between the center of the insulating substrate 33-1 and the end portion thereof on the coolant outlet 53.

Owing to such a configuration of the first header part 54, the coolant flows through the cooling fins 41 obliquely from not only the side plane of the cooling fins 41 but also the edges of the pins configuring the cooling fins 41, toward the coolant outlet 53, in the direction shown by the dashed arrow shown in FIGS. 5(a) and 5(b). Pressure loss can be reduced by increasing the area of the cooling fins 41 exposed into the first header part 54, which is viewed from the coolant supplied from the coolant inlet 52. Pressure loss occurring in the first header part 54 can be limited to a required level by setting the end of the inclined bottom surface within the range described above.

The second header part 55 has an enlarged portion with a gradually increasing cross-sectional area, which has an inclined surface for discharging the coolant from the cooling fins 41 toward the coolant outlet 53, and a reduced portion with a gradually reducing cross-sectional area, which has a side wall that is inclined in such a manner as to cause the coolant to flow from a side plane of the cooling fins 41 to gather at the coolant outlet 53.

The bottom surface of the enlarged portion of the second header part 55 is inclined at a position of an end portion of the bottom plane of the cooling fins 41 on the coolant outlet 53 side. The angle (acute angle β) formed by the bottom surface 55A (FIG. 5(a)) of the second header part 55 and the bottom plane of the cooling fins 41 is larger than the angle α formed by the bottom surface of the first header part 54 and the bottom plane of the cooling fins 41.

The bottom plane 51A (FIG. 5(a)) of the cooling unit 51 between the first header part 54 and the second header part 55 is stretched out between the bottom surface of the first header part 54 and the bottom surface of the second header part 55 and is substantially parallel to the bottom plane of the cooling fins 41. The narrower the gap between this substantially parallel region of the cooling unit 51 and the bottom plane of the cooling fins 41, the greater the cooling performance can be. It is preferred that the gap be, for example, 0.2 mm to 0.8 mm in view of thermal distortion and the like of the heat dissipation base.

Providing a predetermined gap between the cooling unit 51 and the cooling fins 41 in this manner can allow the coolant to flow through the cooling fins 41 immediately below the insulating substrates 33-2 and 33-3 disposed on the downstream side of the insulating substrate 33-1, achieving sufficiently high cooling efficiency.

The shapes of the first header part 54 and the second header part 55 are asymmetric with respect to the cooling unit 51, wherein the volume of the first header part 54 is greater than that of the second header part 55 and the areas of the side plane and bottom plane of the cooling fins 41 on the coolant inlet 52 side that are exposed into the first header part 54 are greater than the area of the side plane of the cooling fins 41 on the coolant outlet 53 side that are exposed into the second header part 55.

Because the first semiconductor device 1 has the first header part 54, the cooling unit 51, and the second header part 55, a sufficiently low-temperature coolant can be supplied even to the cooling fins 41 immediately below the insulating substrates 33-2 and 33-3 to efficiently cool the power semiconductor chips 31 mounted in the cooler 50 between the first header part 54 and the second header part 55. Therefore, the power semiconductor chips 31 mounted in the three insulating substrates can be cooled evenly. Even when a pump of the same performance is used, the maximum temperature of the power semiconductor chips 31 can be made lower than that of the prior art, resulting in providing the semiconductor device 1 of excellent cooling performance. The effects described above can be obtained favorably by making the area of the bottom plane of the cooling fins 41 exposed into the first header part 54 greater than the area of the side plane of the cooling fins 41 exposed into the first header part 54.

The shape of the bottom surface of the first header part 54 can be changed in a various manner, as shown in FIGS. 6(a) to 6(d).

Figure 6B:
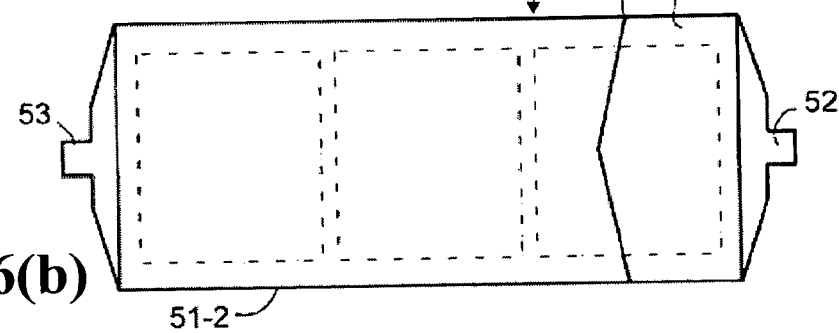
Figure 6C:
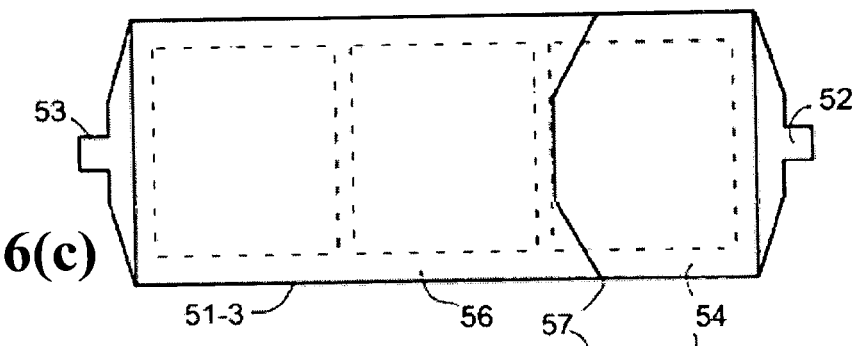
Figure 6D:
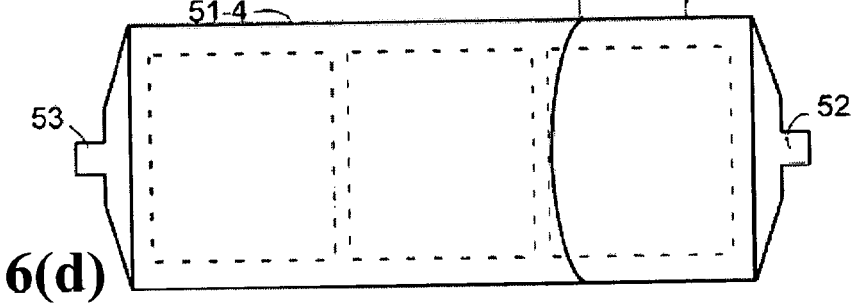

FIG. 6(a) shows an example of a boundary 57 that appears as a straight top portion (an intersection in the shape of a letter "I") between the bottom surface of the first header part 54 and a surface 56 substantially parallel to the bottom plane of the cooling fins 41. The surface 56, substantially parallel to the bottom plane of the cooling fins 41, is positioned between the bottom surface of the first header part 54 and the bottom surface of the second header part 55 and is stretched out thereto. FIGS. 6(b) to 6(d) each illustrate an example in which the center of the boundary 57 in FIG. 6(a) is curved into a C-shape toward the coolant outlet 53. In all of these examples, the boundary 57 is located in a section corresponding to the region between center of the insulating substrate 33-1 and its end portion on the coolant outlet 53, i.e., immediately below the region, the insulating substrate 33-1 being shown by a two-dot chain line in the vicinity of the coolant inlet 52. Because the downstream-side end portion of the first header part 54 is curved into a convex C-shape toward the downstream side as shown in FIGS. 6(b) to 6(d), the cooling efficiency in the width direction of the cooling unit 51 can be made further uniform.

The semiconductor device 1 and the cooler 50 described above can be produced by a conventionally known method.

FIGS. 7(a)-7(d) are cross-sectional diagrams showing the principal parts of a conventional semiconductor device. Note, in FIGS. 7(a)-7(d), that the same reference numerals are used to indicate the components that are the same as those illustrated in FIGS. 1 to 6(d), and therefore, the descriptions thereof are omitted accordingly.

The conventional semiconductor device shown in FIGS. 7(a)-7(d) are different from the semiconductor device 1 according to the embodiment of the present invention that is described with reference to FIGS. 5(a) and 5(b), in terms of the following features.

Figure 7A:
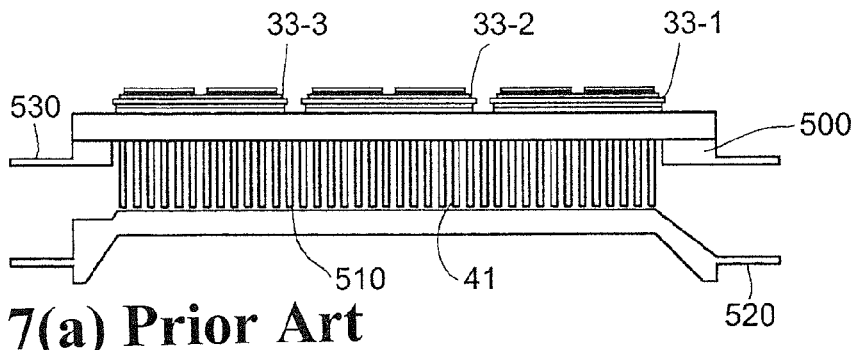
FIGS. 7(a)-7(d) are cross-sectional diagrams showing the principal parts of a conventional semiconductor device.
Figure 7B:
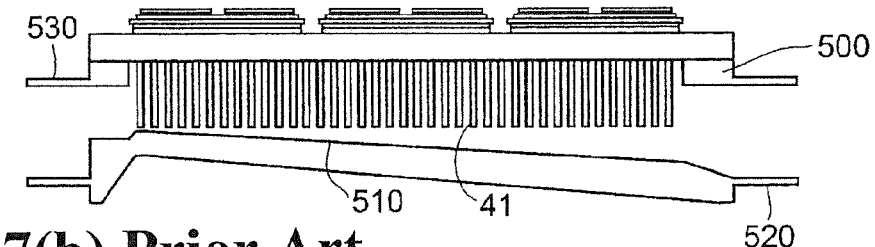
Figure 7C:
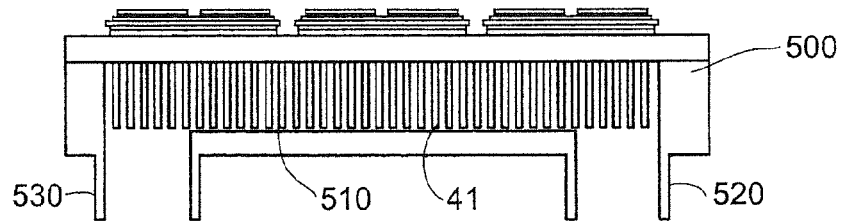
Figure 7D:
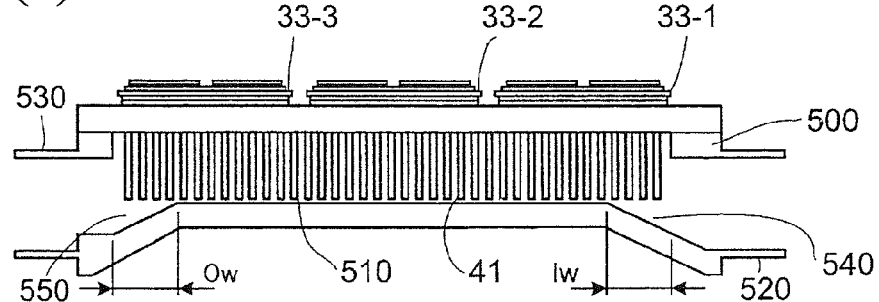

For instance, in the semiconductor device shown in FIG. 7(a), a cooling unit 510 of a cooler 500 does not have the space corresponding to the first header part 54 of the embodiment of present invention. In the semiconductor device shown in FIG. 7(b), on the other hand, the cooling unit 510 does not have the surface 56 parallel to the bottom plane of the cooling fins 41, which is located between the first and second header parts 54 and 55 of the embodiment of the present invention. In the semiconductor device shown in FIG. 7(c), the cooling unit 510 does not have the spaces corresponding to the first and second header parts 54 and 55 of the embodiment of the present invention, and a coolant inlet 520 and a coolant outlet 530 are attached to the bottom portion of the cooling unit 510, unlike the configuration described in the embodiment of the present invention. In the semiconductor device shown in FIG. 7(d), the cooling unit 510 of the cooler 500 has a first header part 540 on the coolant inlet 520 side and a second header part 550 of the same shape and size on the coolant outlet 530 side in such a manner as to be symmetric to the first header part 540. The length Iw of the inclined region of the bottom surface of the first header part 540 is approximately equal to the length Ow of the inclined region of the bottom surface of the second header part 550.

Figure 8A:
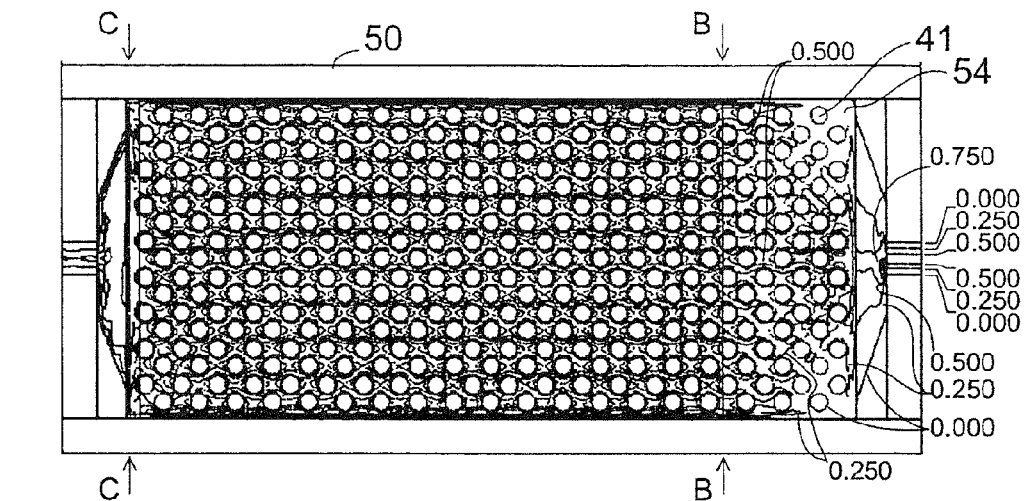
Figure 8B:
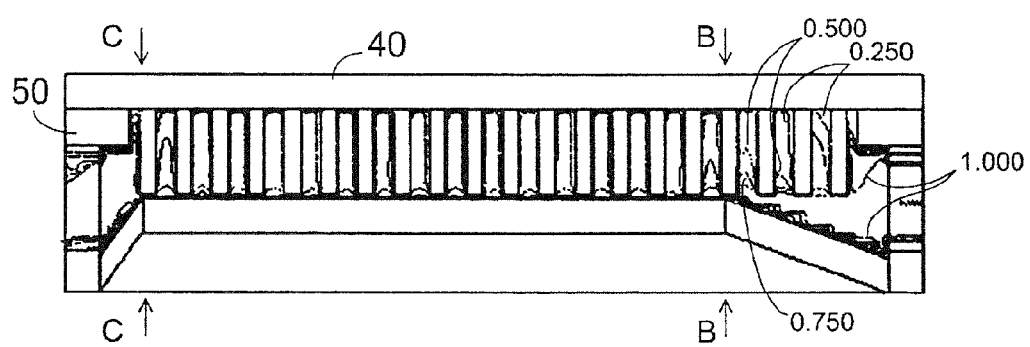

FIGS. 8(a) and 8(b) are contour diagrams showing a numerically calculated distribution of flow velocities of the coolant in the semiconductor device 1 according to the embodiment of the present invention, wherein FIG. 8(a) is a plan view and FIG. 8(b) is a side view. This calculation example is applied mainly to the cooler 50 in which the end portion of the first header part 54 at the position B-B shown in FIGS. 8(a) and 8(b) is in the shape of a letter "I."

FIGS. 9(a) and 9(b) are contour diagrams showing a numerically calculated distribution of flow velocities of a coolant in the conventional semiconductor device, wherein FIG. 9(a) is a plan view and FIG. 9(b) is a side view. This calculation example is applied mainly to the cooler 500 shown in FIG. 7(a).

FIGS. 8(a) to 9(b) show the distribution of flow velocities in which the flow rates of the coolant are 10 L/min. The numerical values (0.000 to 1.000) shown in these diagrams indicate the flow velocities (unit: m/s) of the coolants. For comparison, the maximum flow velocity is set at 1.000 m/s for the both coolants.

When comparing the flow velocity distribution of FIGS. 8(a) and 8(b) according to the embodiment of the present invention with the conventional one shown in FIGS. 9(a) and 9(b), the semiconductor device 1 according to the embodiment of the present invention has a low flow velocity in the cooling fins 41 at the first header part 54, and the flow velocity changes slowly. Moreover, a substantially uniform distribution is obtained between downstream-side end portion of the first header part 54 (the position B-B shown in FIGS. 8(a) and 8(b)) and the downstream-side end portion of the cooling fins 41 (the position C-C shown in FIGS. 8(a) and 8(b)). Therefore, the cooling performance of the cooler 50 is substantially uniform between the coolant inlet 52 and the coolant outlet 53, leading to a reduction in pressure loss.

For example, as a result of numerically calculating the junction temperature of the power semiconductor chips 31 mounted in the insulating substrates 33-1, 33-2, 33-3, with the length Iw shown in FIG. 5(a) being set at 15 mm, the length Ow at 1 mm, and the length of the cooling fins 41 at 10 mm, the temperature of the chips mounted in the insulating substrate 33-1 on the coolant inlet 52 side was approximately 134.7° C., and the temperature of the chips mounted in the insulating substrate 33-3 on the coolant outlet 53 side was approximately 136.0° C., the difference being approximately 1.3° C. In addition, the pressure loss was 9.3 kPa. However, as a result of the same calculation with Iw 1 mm and Ow 1 mm shown in FIG. 7(d), the difference between the temperatures was approximately 2.7° C. and the pressure loss was 11.1 kPa.

In the prior art, reducing the length of the cooling fins 41 did not evenly cool the plurality of power semiconductor chips 31 disposed in the longitudinal direction, but the semiconductor device 1 according to the embodiment of the present invention can provide the excellent effect of keeping the temperature difference low even after further reducing the length of the cooling fins 41 as short as, for example, to approximately 6 mm.

Furthermore, as a result of another numerical calculation on the conventional semiconductor device shown in FIG. 7(*d*) where the lengths of Iw and Ow were equal to each other and changed from 1 to 5, 10, and 15 mm, it was found that the temperatures of all of the power semiconductor chips mounted in the insulating substrates 33-1, 33-2, 33-3 increased when the length Iw (Ow) was increased from 1 mm to 15 mm, making it impossible to evenly cool the power semiconductor chips.

As described above, in the semiconductor device 1 and the cooler 50 according to the embodiment of the present invention, the cooling unit 51 of the cooler 50 has the first header part 54, which has at least the bottom surface inclined toward the bottom plane of the cooling fins 41, and the second header part 55, which has at least the bottom surface inclined from the end portion of the bottom plane of the cooling fins 41. Owing to this configuration, the coolant supplied from the coolant inlet 52 flows through the cooling fins 41 from the side plane and bottom plane of the cooling fins 41 on the coolant inlet 52 toward the coolant outlet 53, and is then discharged from the side plane of the cooling fins 41 to the coolant outlet 53. As a result, the pressure loss and cooling efficiency in the first header part 54 can be lowered, resulting in cooling the power semiconductor chips 31 of the three insulating substrates 33 substantially evenly and reducing the pressure loss of the cooler 50, the insulating substrates 33 being disposed in the longitudinal direction of the cooling unit 51.

It should be noted that the embodiment described above is to illustrate the specific examples of the present invention. Therefore, needless to say, the present invention should not be construed as being limited to the embodiment, and various modifications can be made to the present invention without departing from the gist thereof.

EXPLANATION OF REFERENCE NUMERALS

1 Semiconductor device
30 Semiconductor module
31 Power semiconductor chip
32 Surrounding case
32*a*, 32*b* Opening stepped surface
32*c* Lid plate
32*e* Sealing member
32*n* Nut
33, 33-1, 33-2, 33-3 Insulating substrate
34, 34-1, 34-2, 34-3 Main terminal
35, 35-1, 35-2 Power supply terminal
35*a* Open hole
36, 36-1 to 36-8 Control terminal
37, 37-1 to 37-4 Opening
Screw seat
FWD
w1, w2, w3 Bonding wire
r1, r2 Lead terminal
40, 40-1 Heat dissipation base plate
41, 41-1, 41-2, 41-3 Cooling fins
50 Cooler
51 Cooling unit
52 Coolant inlet
53 Coolant outlet
54 First header part
55 Second header part

The invention claimed is:

1. A semiconductor device comprising:
a semiconductor module having a substrate and a power semiconductor elements;
a heat dissipation base;
cooling fins forming a cluster of at least one of a plurality of pin members or a plurality of blade members, the cluster having a rectangular cuboid contour and provided on a first principal surface of the heat dissipation base;
a cooler fixed to the heat dissipation base and having a cooling unit accommodating the cooling fins therein and a coolant inlet and a coolant outlet formed at respective ends of the cooling unit to face each other in a longitudinal direction;
a first substrate having at least a first one of the power semiconductor elements, the first substrate bonded to a second principal surface of the heat dissipation base at a coolant inlet side such that a position of the first substrate corresponds to a position of the cooling fins; and
a second substrate having at least a second one of the power semiconductor elements, the second substrate bonded to the second principal surface of the heat dissipation base at a coolant outlet side,
wherein the cooling unit includes:
a first header part having at least a first bottom surface that is inclined toward a bottom plane of the cooling fins so that a coolant supplied from the coolant inlet flows from a side plane of the cooling fins and the bottom plane of the cooling fins on the coolant inlet side into the cooling fins and toward the coolant outlet;
a second header part having at least a second bottom surface that is inclined from an end portion of the bottom plane of the cooling fins so that the coolant discharged from the cooling fins flows to the coolant outlet, and
a third bottom surface extending between the first bottom surface and the second bottom surface and parallel to the bottom plane of the cooling fins,
wherein an inclination angle of the first bottom surface with respect to the bottom plane of the cooling fins is smaller than an inclination angle of the second bottom surface with respect to the bottom plane of the cooling fins, and
wherein a top portion in which the first bottom surface and the third bottom surface intersect, is located between a lower part of a center of the first substrate and a lower part of an end portion of the first substrate on the coolant outlet side.

2. The semiconductor device according to claim 1, wherein a volume of the first header part is greater than that of the second header part.

3. The semiconductor device according to claim 1, wherein an inner diameter of a pipe connected to the coolant inlet and the coolant outlet is greater than a height of the at least one of the blade members or pin members.

4. The semiconductor device according to claim 1, wherein a side wall of the cooling unit is not located immediately below the first substrate and the second substrate.

5. The semiconductor device according to claim 1, wherein the cooling fins are the pin members, the pin members each having a circular, oval, or polygonal cross-sectional shape, and the pin members are staggered on the heat dissipation base.

6. A semiconductor device comprising:
a semiconductor module having power semiconductor elements;
a heat dissipation base;
cooling fins forming a cluster of at least one of a plurality of pin members or a plurality of blade members, the cluster having a rectangular cuboid contour and provided on a first principal surface of the heat dissipation base;
a cooler fixed to the heat dissipation base and having a cooling unit accommodating the cooling fins therein and a coolant inlet and a coolant outlet formed at respective ends of the cooling unit to face each other in a longitudinal direction;
a first substrate having at least a first one of the power semiconductor elements, the first substrate bonded to a second principal surface of the heat dissipation base at a coolant inlet side such that a position of the first substrate corresponds to a position of the cooling fins; and
a second substrate having at least a second one of the power semiconductor elements, the second substrate bonded to the second principal surface of the heat dissipation base at a coolant outlet side,
wherein the cooling unit includes:
  a first header part for supplying a coolant from the coolant inlet toward the cooling fins; and
  a second header part for discharging the coolant from the cooling fins to the coolant outlet,
  areas of a side plane of the cluster of the cooling fins and a bottom plane of the cluster of the cooling fins exposed into the first header part are greater than areas of a side plane of the cluster of the cooling fins exposed to the second header part,
  the areas of the bottom plane of the cooling fins exposed into the first header part are greater than the areas of the side plane of the cooling fins exposed into the first header part,
  a first bottom surface of the first header part is inclined toward the bottom plane of the cooling fins,
  a second bottom surface of the second header part is inclined from an end portion of the bottom plane of the cooling fins on the coolant outlet side,
  a third bottom surface extends between the first bottom surface and the second bottom surface and parallel to the bottom plane of the cooling fins, and
  a top portion in which the first bottom surface and the third bottom surface intersect is located between a lower part of a center of the first substrate and a lower part of an end portion of the first substrate on the coolant outlet side.

7. A cooler for cooling a semiconductor module, comprising:
a heat dissipation base;
at least two substrates bonded co-planar with each other on the heat dissipation base;
power semiconductor elements mounted on each of the substrates;
cooling fins forming a cluster of at least one of a plurality of pin members or a plurality of blade members, the cluster having a rectangular cuboid contour and provided on the heat dissipation base;
a cooling unit accommodating the cooling fins therein; and
a coolant inlet and a coolant outlet that are formed at respective ends of the cooling unit to face each other in a longitudinal direction,
wherein the cooling unit includes:
  a first header part having at least a first bottom surface inclined toward a bottom plane of the cooling fins so that a coolant supplied from the coolant inlet flows from a side plane of the cooling fins and the bottom plane of the cooling fins on the coolant inlet side into the cooling fins and toward the coolant outlet; and
  a second header part having at least a second bottom surface inclined from an end portion of the bottom plane of the cooling fins so that the coolant discharged from the cooling fins flows to the coolant outlet, and
  the cooler unit is used by being fixed to the heat dissipation base,
the at least two substrates include a first substrate disposed on the coolant inlet side and a second substrate disposed on the coolant outlet side so as to be co-planar to the first substrate,
the first bottom surface is inclined toward the bottom plane of the cooling fins corresponding to a region between a center of the first substrate and an end portion of the first substrate on the coolant outlet side,
a third bottom surface extends between the first bottom surface and the second bottom surface and parallel to the bottom plane of the cooling fins, and
a top portion in which the first bottom surface and the third bottom surface intersect is located between a lower part of a center of the first substrate and a lower part of an end portion of the first substrate on the coolant outlet side.

8. The cooler according to claim 7, wherein the first header part and the second header part are formed such that an inclination angle of the first bottom surface with respect to the bottom plane of the cooling fins is smaller than an inclination angle of the second bottom surface.

* * * * *